United States Patent
Ocansey et al.

(10) Patent No.: US 7,226,802 B2
(45) Date of Patent: Jun. 5, 2007

(54) TUNGSTEN COATED SILICON FINGERS

(75) Inventors: Paul M. Ocansey, Gilbert, AZ (US); Juergen A. Foerstner, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 306 days.

(21) Appl. No.: 10/914,006

(22) Filed: Aug. 6, 2004

(65) Prior Publication Data
US 2006/0027020 A1     Feb. 9, 2006

(51) Int. Cl.
    *H01L 21/00*    (2006.01)
(52) U.S. Cl. .......................................... 438/48; 438/50
(58) Field of Classification Search ................. 438/48, 438/50
    See application file for complete search history.

(56) References Cited

U.S. PATENT DOCUMENTS

| | | |
|---|---|---|
| 5,738,731 A | 4/1998 | Shindo et al. |
| 6,013,933 A | 1/2000 | Foerstner et al. |
| 6,025,252 A | 2/2000 | Shindo et al. |
| 6,106,734 A | 8/2000 | Shindo et al. |
| 6,137,120 A | 10/2000 | Shindo et al. |
| 6,177,706 B1 | 1/2001 | Shindo et al. |
| 6,383,923 B1 * | 5/2002 | Brown et al. ............... 438/666 |
| 6,486,511 B1 * | 11/2002 | Nathanson et al. ......... 257/328 |

FOREIGN PATENT DOCUMENTS

EP      0659910 A2    6/1995

OTHER PUBLICATIONS

Maggie Chau et al., "Silicon Nanowire-Based Nanoactuator" 3rd IEEE Conference on Nanotechnology, Aug. 12-14, 2003, pp. 879-880.*
T.C. Wong et al., "Gold nanowires from silicon nanowire templates", Applied Physics Letters, vol. 84, No. 3, pp. 407-409, Jan. 19, 2004.*
Rong Fan et al., "Fabrication of Silica Nanotube Arrays from Vertical Silicon Nanowire Templates", Journal of American Chemical Society, vol. 125, pp. 5254-5255, Year 2003.*

* cited by examiner

Primary Examiner—W. David Coleman
(74) Attorney, Agent, or Firm—Ingrassia Fisher & Lorenz

(57) ABSTRACT

Methods and apparatus are provided for preparing sensing fingers for use in a highly integrated accelerometer. The method includes steps for forming a tungsten/tungsten silicide coating on a silicon finger. The tungsten/tungsten silicide coating adds mass to the silicon finger. The method includes steps of forming silicon fingers from layers of silicon, oxides, and capping material. The silicon fingers are then exposed to tungsten containing gases under conditions to promote the formation of a tungsten silicide seed layer on the exposed silicon surfaces. The tungsten layer is then grown to a desired thickness through a growth step. The coated silicon fingers display improved resistance to stiction as compared to uncoated silicon fingers.

17 Claims, 3 Drawing Sheets

TUNGSTEN COATED SILICON FINGERS

FIELD OF THE INVENTION

The present invention generally relates to micromachined accelerometers, and more particularly relates to tungsten coatings applied to arrays of suspended silicon fingers in a highly integrated accelerometer.

BACKGROUND OF THE INVENTION

MEMS (Micro-Electro-Mechanical Systems) accelerometers, also sometimes referred to as Highly Integrated Accelerometers (HIA), are used in a variety of applications including as triggering sensors for air bag deployment. An HIA is designed to sense changes in acceleration at a defined sensitivity threshold. Events that satisfy the defined acceleration criteria electronically activate a signal, which in turn is used to initiate a desired device response, such as, for example, inflation of a safety air bag.

A MEMS accelerometer typically includes structures known as sensing fingers. In a common design, the sensing fingers are fabricated of silicon from the underlying silicon substrate of the electronic device. A sensing finger is a three dimensional structure, typically with high aspect ratio, and in the general shape of a wall. A sensing finger is designed to deflect physically in response to a sensed acceleration. Thus, it is typically desired to fabricate a sensing finger, or preferably an array of sensing fingers, with a given spacing and resistance to deflection.

Typically, an array of sensing fingers is integrally created in an HIA. Electrical charge in the finger array creates a capacitance between adjacent fingers. Rapid accelerations of the HIA result in a physical deflection of neighboring fingers. This physical deflection affects the capacitance of the array. The device to which the array is attached senses the change in capacitance, and this initiates the device signal.

One drawback to current methods of fabricating sensing fingers is finger stiction. If two or more fingers bend or deflect, they may come into contact with one another. The contact can also result in the fingers adhering to each other. This is finger stiction. Stiction can arise for a variety of reasons including capillary forces, electrostatic forces, and Van der Walls attraction. Stiction is undesirable for the reason that it leads to failure of the accelerometer. Contact between fingers can cause an electrical short thereby upsetting the designed electrical function of the device. Additionally, the result of two fingers in contact results in a mechanical stiffening of the structure, which may itself affect the designed deflection resistance of the device.

There is a further movement in the design of HIAs and MEM accelerometers to increase the aspect ratio of the silicon fingers such that the fingers grow in height for a given width. This trend results from a desire to decrease the footprint of the finger array on a base without decreasing the capacitance area in the array. One way to achieve this is to increase the vertical height of a silicon finger. However, finger elongation further aggravates stiction problems; it creates a physical setting in which any bending of the silicon fingers are additionally susceptible to stiction. The geometry of elongated fingers lowers the threshold at which bending or warping places adjacent fingers in contact.

It is further desired to improve the sensitivity of HIAs. As these devices are often used in the triggering of safety equipment, it is desired to improve the functional sensitivity if possible. Generally sensitivity of a finger array is a function of displacement/acceleration. Additionally the sensitivity may be characterized as mass of the finger/finger spring constant. Thus, adding mass to silicon fingers has the added benefit of improving the device sensitivity.

Accordingly, it is desirable to redesign currently used accelerometers. In particular it is desired to design and manufacture an accelerometer so as to reduce finger stiction. In addition, it is desirable to design an accelerometer with improved sensitivity. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
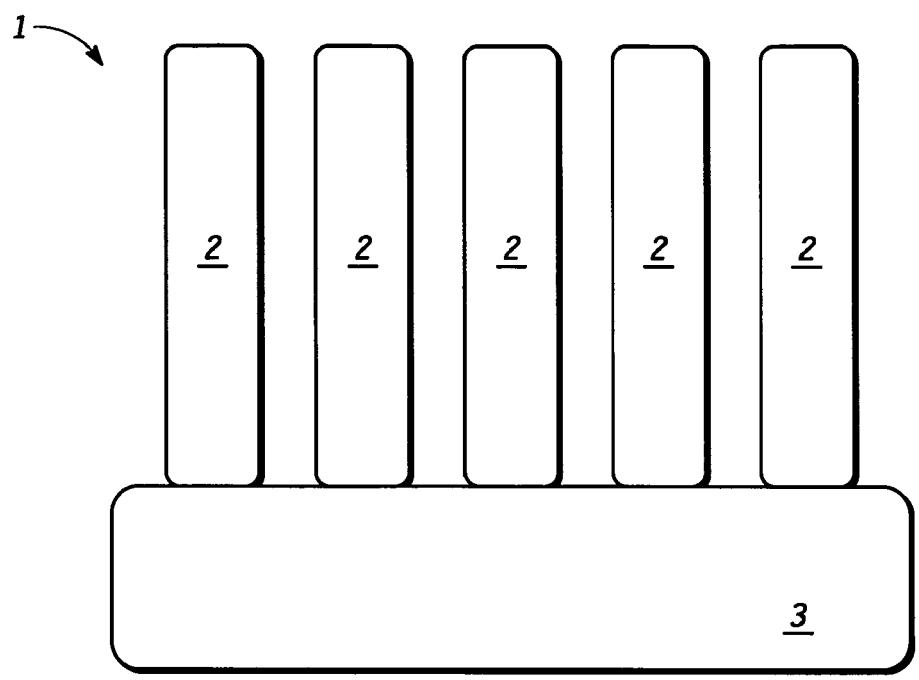
FIG. 1 is a profile view of an array of silicon fingers on a substrate.

Referring to FIG. 1 there is shown an array 1 of silicon fingers 2 positioned on a substrate 3. The fingers in this representation do not include a coating. The array is a structure that may be included in an HIA. The fingers 2 are generally elongate structures with a high aspect ratio. The structure of FIG. 1 represents fingers in an ideal setting. The fingers are parallel in orientation and do not display any contact between them.

Figure 2:
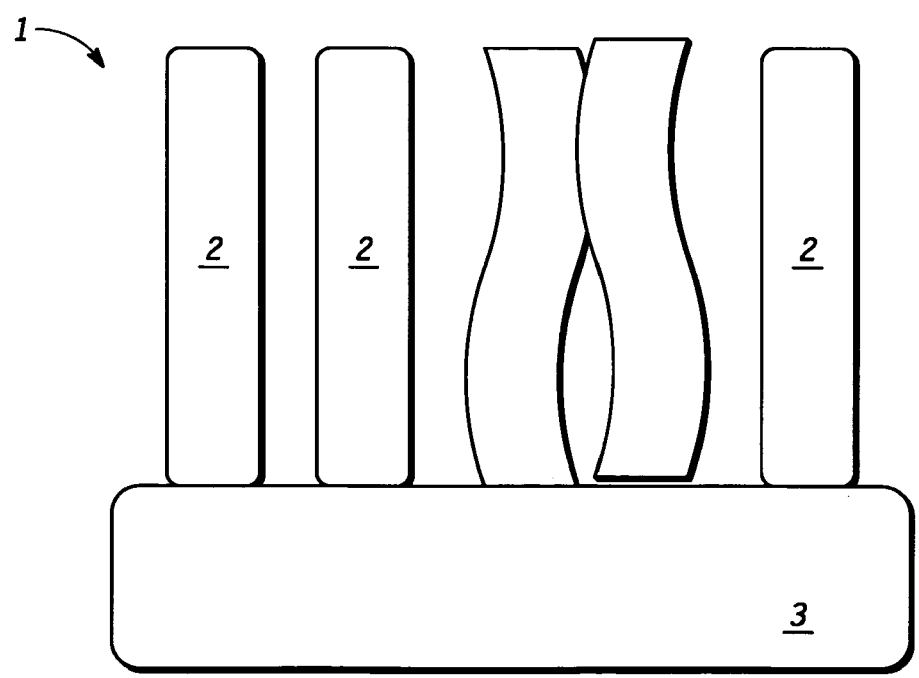
FIG. 2 is a profile view of an array of silicon fingers subject to stiction.

Referring now to FIG. 2 there is shown an array 1 of fingers 2 under less than ideal conditions. Again the fingers 2 are uncoated. In FIG. 2 some fingers 2 of the array are in contact due to stiction. Forces have warped and bent the fingers. As a result adjacent fingers have come into contact with each other at one point. This contact can degrade the capacitance that would otherwise between the fingers, and thus affects performance of the accelerometer to which the fingers are attached.

It has now been discovered that a tungsten coating can be selectively deposited on silicon fingers. The tungsten-coated fingers display improved resistance to stiction. Further, the tungsten-coated fingers display improved sensitivity over non-coated fingers. The tungsten-coated fingers thus display improved performance as triggering sensors in a highly integrated accelerometer.

Figure 3:
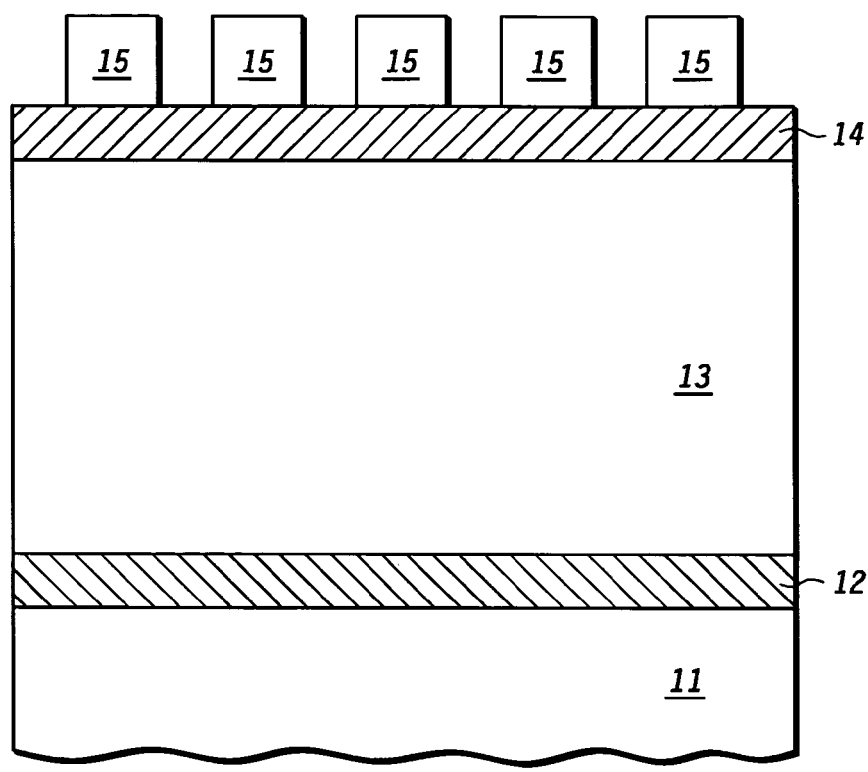
FIG. 3 is a view of a multilayer structure that may be fabricated into a silicon finger array according to an embodiment of the present invention.

A method of fabricating the tungsten-coated silicon fingers is now described. Referring to FIG. 3 there is shown one embodiment of a structure from which the coated silicon fingers may be constructed. The structure comprises a first layer of silicon 11, such as monosilicon. Above the silicon layer 11 is an oxide layer 12; the oxide layer may comprise silicon dioxide. Above oxide layer 12 is a second silicon layer 13, which may comprise monosilicon or polycrystalline silicon. Above layer 13 is a hard mask 14. And above hard mask 14 is a photo resist 15. The structure of FIG. 3 can be fabricated using methods known in the semiconductor industry.

As is known in the semiconductor manufacturing art, the structure in FIG. 3 may be subjected to a patterning whereby channels are cut into the hard mask 14 and the silicon layer 13 up to the oxide layer 12. One process to accomplish the patterning is a dry etching technique. The photo resist 15 may then be removed by known techniques.

Figure 4:
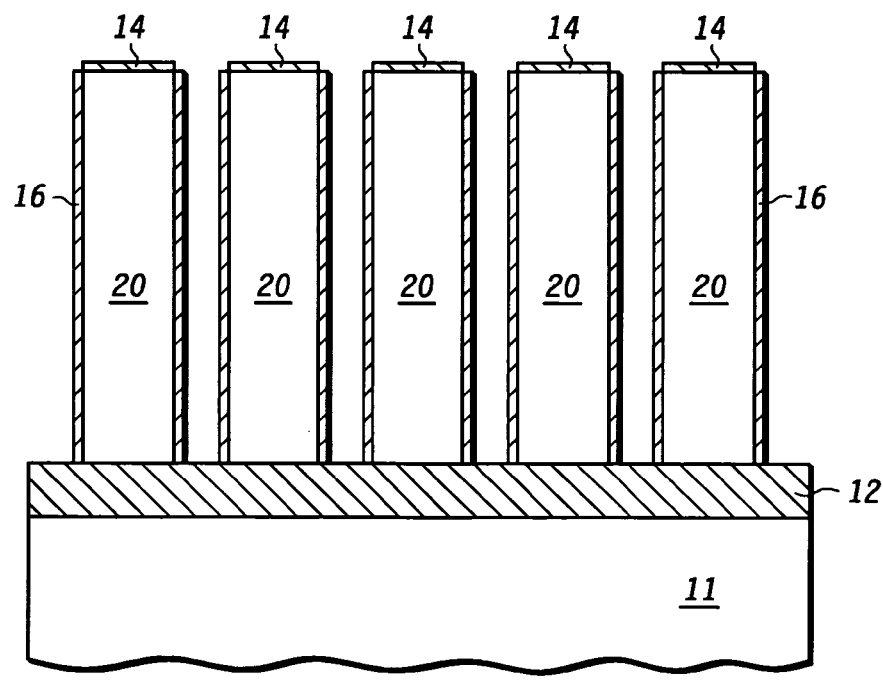
FIG. 4 is a profile view of an array of silicon fingers positioned on a substrate that may be further processed according to an embodiment of the present invention.

What then remains is a structure as shown in FIG. 4. In that figure, the general shape of the silicon fingers 20 has now been defined. Generally, the finger is a high aspect structure (height/width). The finger is also a three dimensional structure although two dimensions are illustrated in FIG. 4. Thus, the finger may continue, for example, in the dimension that extends into and out of the surface of the page. A hard mask cap 14 remains on the upper surface of the fingers 20. This hard mask cap is the remnant of the hard mask layer 14 in the structure of FIG. 3.

Fingers 20 are preferably a silicon material. They may be polysilicon or single crystal silicon. Bulk micromachining techniques generally call for the use of single crystal. The industry tendency is to go to bulk micromachining. Surface micromachining techniques allow the use of polysilicon materials.

It will be appreciated by those skilled in the art that fingers 20 are partly defined by their width and the spacing between them. These dimensions may be set by the width and spacing of the photo resist 15 as shown in FIG. 3. In one preferred embodiment, the spacing between the silicon fingers is approximately 1.5 µm. Other spacings are also possible. It is optionally preferred to fabricate an array with inter-finger spacing of between approximately 1.0 µm to approximately 2.0 µm. Likewise the length of the fingers can be determined by the thickness of silicon layer 13 as shown in FIG. 3. That is because the etching that cuts through this layer terminates at oxide layer 12. Thus the thickness of the layer 13 corresponds to the length of a finished finger 20 in FIG. 4.

Fingers 20 can thus be fabricated with different lengths. In a preferred embodiment, the length of fingers 20 is between about 5 microns to about 21 microns. It is preferred to design a finger with dimensions and spacing so as to achieve a desired capacitance for the array. The capacitance is related to the area between the fingers. Thus, to achieve a given area between fingers, an increase in the height of the finger dimension can lead to a reduction in the number of fingers or the length of the fingers.

At this point, the tungsten coating can be grown on fingers 20. In a preferred embodiment, the finger array receives the tungsten coating while the hard mask cap 14 remains on the silicon finger. Optionally, the hard mask cap 14 may be removed prior to deposition of the tungsten coating. Techniques known in the semiconductor industry may be used to remove a hard mask cap.

The formation of the tungsten layer preferably takes place by a combination of deposition and growth steps. A first reaction involves the formation of a tungsten seed layer by the silane reduction of tungsten hexafluoride. The seed layer is preferably a layer of tungsten silicide. There follows a growth step involving the continued reduction of tungsten hexafluoride using hydrogen gas. Preferably both process steps follow chemical vapor deposition (CVD) procedures. CVD deposition techniques are well known. The equipment is readily available and reasonably priced. CVD is also preferred for the reason that it provides good coverage of the substrate.

The formation of a tungsten seed layer follows the reaction represented in the following equation:

The reaction begins to occur even at moderate temperatures, as low as 90° C. Lower temperature reactions tend to promote formation of alpha phase tungsten, and higher temperature reactions tend to develop beta phase tungsten layers. However, higher temperatures are generally preferred in order to limit the amount of fluorine appearing in the tungsten layer and to speed the reaction. Reactant ratios of $WF_6/SiH_4$ also may affect the reaction. Higher silane concentration favors the development of beta phase tungsten layers. In this reaction, a seed layer of tungsten silicide is formed on the silicon finger.

The growth step follows the reaction in the following equation:

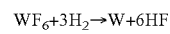

The hydrogen reduction results in good coverage with a well-crystalized film. This reaction occurs at a temperature of between approximately 300° C. to approximately 500 C. Deposition rates increase at increased pressure of 10 to 60 Torr. However, lower pressures favor tungsten layers with lower tensile stresses.

The hydrogen reaction is generally not preferred as a mechanism to deposit a seed layer in that the high reactivity of $WF_6$ with Si can result in excessive Si consumption, encroachment of the $Si/SiO_2$ interface, and wormhole formations. In contrast the silane reduction reaction generally does not disturb the silicon substrate.

The tungsten deposition involves a temperature dependent chemical reaction. Thus, the deposition may take place at any temperature that promotes the reaction. It is preferred that the reaction take place at approximately 400° C. Alternatively, the reaction may take place at a temperature of between approximately 300° C. to approximately 500° C.

Tungsten depositions are further characterized by good conformality. The thickness of the coating is generally even at differing points of the underlying surface. 0Preferably the seed layer is coated on all exposed surfaces of the silicon fingers.

Tungsten hexafluoride is a proven and well-characterized source of tungsten. It is a popular tungsten precursor due to its availability with high purity and at low cost. Tungsten hexafluoride is a volatile liquid at room temperature. The vapor may be delivered in the CVD process directly through a metering device. $WF_6$ will react readily with moisture to produce tungsten oxides and hydrofluoric acid (HF). Thus, it is important to avoid moisture in the mass flow and reaction apparatus. Tungsten hexafluoride reactions produce HF as a byproduct of the reaction. HF is a potentially hazardous material, and good operating procedures should be followed in dealing with this material.

Other reducing agents may also be used with $WF_6$. In one embodiment, a dichlorosilane ($SiCl_2H_2$) is used as a reducing agent. Thus a dichlorosilane reduction may also be used in a reaction step. Combinations of reducing agents, $SiCl_2H_2$ and $SiH_4$ may also be used.

Following the deposition of a seed layer, such as the formation of a layer of tungsten silicide, there preferably takes place a growth step of the tungsten crystal. In one embodiment, the growth step continues in the same CVD chamber in which the seed layer was deposited. The growth step is a continuation of the seed deposition step in that reactants introduced into the chamber are changed, if desired, while other parameters such as temperature, pressure, and flow rates can similarly be modified, if desired. In a preferred embodiment, the reducing agent is changed from a silane to hydrogen as described above.

Both the seed formation and growth steps are selective reactions in that the tungsten will not readily react with the silicon dioxide surfaces. Thus, the tungsten material grows only on the exposed silicon of the finger. When the finger is capped, as with silicon dioxide, growth of the tungsten layer is limited to the walls of the finger.

It will be understood by those skilled in the art that reaction parameters such as time, temperature, and pressure can be varied so as to affect the amount of tungsten that is deposited on the surface of the silicon fingers. The amount of tungsten material corresponds to the thickness of the coating. The thickness of the coating may be set by design requirements, and thus, for varying designs, the thickness of the coating may change.

Additionally, the thickness of the tungsten coating affects the mass of the silicon finger structure. The coating, depending on its microstructure and thickness, further affects the spring constant of the finger. Both mass and spring constant are factors in the sensitivity of the finger. Thus, the tungsten coating can improve the HIA sensitivity. In the application of tungsten-coated silicon finger arrays for use in HIAs it is preferred to provide a coating thickness of approximately 2000 Å.

Figure 6:
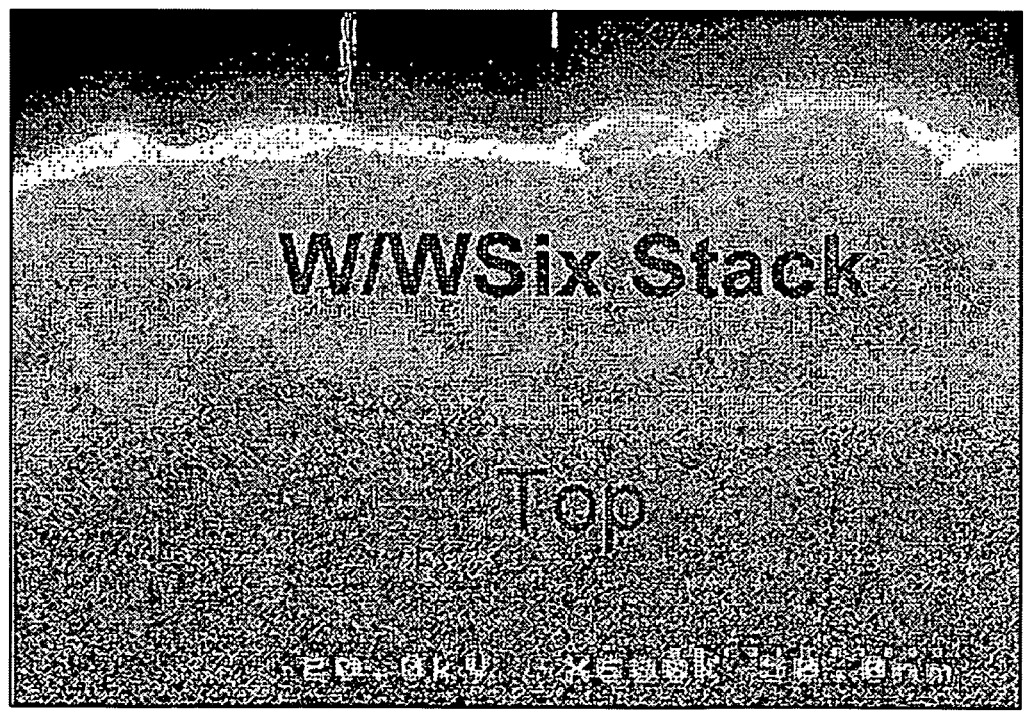
FIG. 6 is a photomicrograph of a tungsten layer deposited on a silicon substrate according to an embodiment of the present invention.

Without wishing to be bound by any theory, the following theoretical explanation of the way in which tungsten coated fingers operate is offered to further illustrate the invention. The surface of the tungsten coating that is deposited on the silicon surface is characterized by a certain degree of roughness. The tungsten crystal surface is not smooth; rather it displays a series of bumps and general unevenness. An illustration of the tungsten surface on a silicon substrate is shown in FIG. 6. The rough surface of the tungsten coating results in a decrease of the contact area when neighboring fingers happen to come into contact. The decrease in the contact area also results in a decrease in the potential attractive force between neighboring fingers. Thus, tungsten-coated fingers are less likely to remain attached when they come into contact from incidental bending forces. Rather the spring force within the finger is more likely to overcome any attractive force, and the spring force tends to right the finger by returning it to an original position.

The structure of the silicon fingers, after completion of the tungsten and tungsten silicide layer, is illustrated in FIG. 4. The tungsten and tungsten silicide layer 16 has been deposited on the side walls of the fingers. The protective cap 14 remains. If desired, tungsten can be deposited on the end walls of the fingers. The end walls are not illustrated in the figure, but correspond to the limit of the finger as it extends in a third dimension out of the page and end to the end of the page. Preferably, end walls are not coated, as they are not contact points between fingers.

If tungsten is deposited on the top of the finger, it can tend to bend the silicon. Tungsten coating on silicon does create a certain level of stressed film on the silicon layer. By balancing the finger, by placing tungsten on opposing sides of the finger, the forces are equalized. However, tungsten on the top of the finger would not be opposed, which could lead to warping or bending of the finger. Thus it is preferred to avoid deposition on the top portion of a finger.

Figure 5:
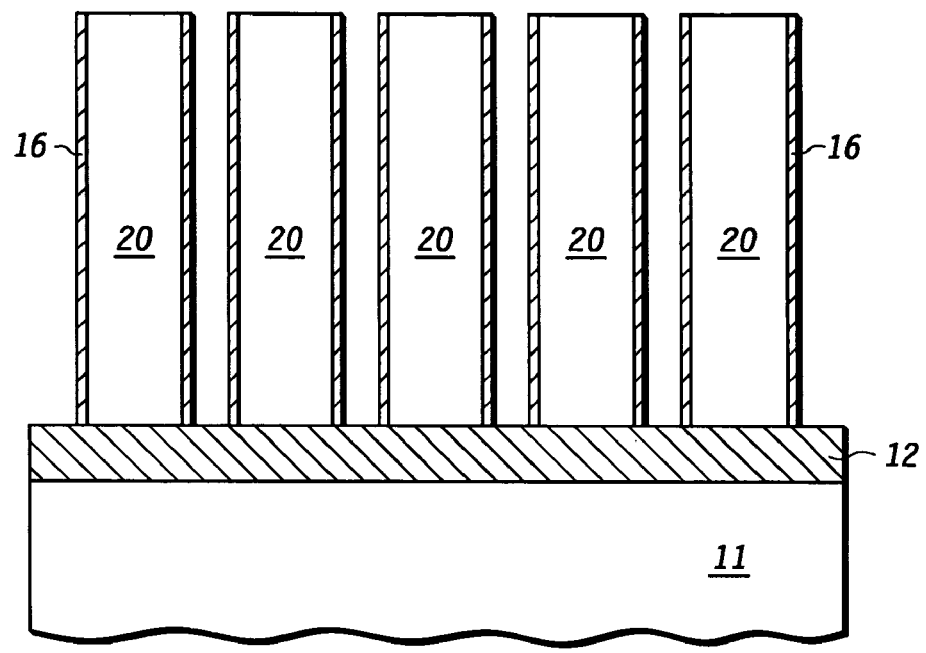
FIG. 5 is a profile view of an array of silicon fingers positioned on a substrate that has received a tungsten coating according to an embodiment of the present invention.

Referring now to FIG. 5 there is shown an array of tungsten-coated silicon fingers after removal of the protective cap. A protective cap is removed by any of the methods known in the art of chip manufacturing. The method chosen depends on the composition of the cap material.

The structure shown in FIG. 5 represents the completion of the coating method. The silicon array may then be processed in a standard manner to develop the desired device, such as an HIA. The aspect ratio of the coated fingers is preferably between about 4 to about 20.

In operation of the coated finger array, the silicon fingers, having increased mass by virtue of the tungsten layer, display improved performance. Increase of the mass of the fingers in the array results in an increase in the sensitivity. The spring constant is the tendency to keep the finger centered. A spring force tends to keep silicon fingers in the center position, the originally fabricated position. An acceleration changes that position. As you go to devices that pick up lower and lower accelerations, the spring constant must be weakened. However, the weakening of the spring constant also weakens the force that tends to keep the fingers vertically arranged on their originally designed position. A weakening allows the fingers to wag, and you get more stiction effects with weaker spring constants.

As described above the tungsten-coated silicon fingers are suitable for use in finger arrays as part of an accelerometer. In particular, the finger array may be used as an acceleration sensor in a highly integrated accelerometer. Additionally, the coated fingers and an array of such may be used as an acceleration sensor for use in a gyroscope.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for constructing an acceleration sensor for use with a highly integrated accelerometer comprising the steps of:

providing a plurality of sensing fingers each sensing finger having an exposed surface;

depositing a seed layer of material on the exposed surface of the sensing fingers; and growing a layer of material on the seed layers deposited on the sensing fingers of the acceleration sensor.

2. The method according to claim 1 wherein the step of providing a sensing finger further comprises providing a sensing finger comprising silicon.

3. The method according to claim 2 wherein the sensing finger comprises polysilicon or single crystal silicon.

4. The method according to claim 1 wherein the step of depositing the seed layer finger further comprises forming a layer of tungsten silicide on the exposed surface of a sensing finger.

5. The method according to claim 1 wherein the step of providing a plurality of sensing finger comprises sensing fingers having an aspect ratio of between 2 and 30.

6. The method according to claim 1 further comprising an array of sensing fingers with spacing.

7. A method for fabricating an array of sensing fingers for use in a highly integrated accelerometer comprising the steps of:
providing a multilayer semiconductor structure comprising a first layer of silicon with a surface, an oxide layer disposed on the surface of the first layer of silicon, a second silicon layer disposed on the oxide layer, a hard mask layer disposed on the second silicon layer;
patterning channels through the hard mask layer and the second silicon layer thereby forming an array of fingers in the second silicon layer and wherein the fingers have exposed walls; growing a seed layer of tungsten silicide on the exposed walls of the array of fingers; growing a coating of tungsten on the seed layer; and
removing the hard mask from the second layer of silicon.

8. The method according to claim 7 wherein the step of patterning channels comprises a dry etching.

9. The method according to claim 7 wherein the step of patterning channels further comprises forming an array of silicon fingers with a space therebetween of approximately 1 μm to 2 μm.

10. The method according to claim 7 wherein the step of growing a seed layer of tungsten silicide further comprises a silane reduction of tungsten hexafluoride.

11. The method according to claim 10 wherein the silane reduction occurs at a temperature of between about 300° degree C. to about 500° degree C.

12. The method according to claim 10 wherein the step of growing a seed layer of tungsten silicide further comprises a dichlorosilane reduction of tungsten hexafluoride.

13. The method according to claim 7 wherein the step of growing a seed layer of tungsten silicide further comprises a chemical vapor deposition process.

14. The method according to claim 7 wherein the step of growing a coating of tungsten further comprises a hydrogen reduction of tungsten hexafluoride.

15. The method according to claim 14 wherein the hydrogen reduction occurs at a temperature of between about 300° degree C. to about 500° degree C.

16. The method according to claim 7 wherein the step of growing a coating of tungsten further comprises a chemical vapor deposition process.

17. The method according to claim 7 wherein the step of growing a coating of tungsten further comprises growing a coating with a thickness of between about 1000 to about 3000 angstroms.

* * * * *